US009373681B2

(12) United States Patent
Lim et al.

(10) Patent No.: US 9,373,681 B2
(45) Date of Patent: Jun. 21, 2016

(54) METHOD FOR FABRICATING CAPACITOR OF SEMICONDUCTOR DEVICE (71) Applicant: SK hynix Inc., Gyeonggi-do (KR)

(72) Inventors: Sung-Won Lim, Gyeonggi-do (KR); Seung-Jin Yeom, Gyeonggi-do (KR); Hyo-Seok Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/966,834

(22) Filed: Dec. 11, 2015

(65) Prior Publication Data

US 2016/0104764 A1 Apr. 14, 2016

Related U.S. Application Data (62) Division of application No. 13/610,588, filed on Sep. 11, 2012, now Pat. No. 9,240,442.

(30) Foreign Application Priority Data

Jun. 29, 2012 (KR) ........................ 10-2012-0071152

(51) Int. Cl.
*H01L 21/20* (2006.01)
*H01L 49/02* (2006.01)
*H01L 27/108* (2006.01)

(52) U.S. Cl.
CPC .......... *H01L 28/91* (2013.01); *H01L 27/10852* (2013.01)

(58) Field of Classification Search
None
See application file for complete search history.

(56) References Cited

U.S. PATENT DOCUMENTS

| 9,240,442 B2* | 1/2016 | Lim ........................ H01L 28/91 |
| 2007/0117333 A1* | 5/2007 | Yoon ................. H01L 27/10817 438/296 |
| 2011/0180863 A1* | 7/2011 | Kennedy ........... H01L 27/10814 257/306 |
| 2012/0205733 A1* | 8/2012 | Kang ................ H01L 27/10852 257/311 |
| 2012/0205779 A1* | 8/2012 | Kim .................. H01L 27/10852 257/532 |
| 2013/0115748 A1* | 5/2013 | Kim ........................ H01L 28/60 438/381 |
| 2013/0244394 A1* | 9/2013 | Kim ........................ H01L 28/91 438/381 |
| 2014/0113431 A1* | 4/2014 | Song ................. H01L 27/10852 438/399 |
| 2015/0017779 A1* | 1/2015 | Kim .................. H01L 27/10852 438/381 |

* cited by examiner

*Primary Examiner* — Alexander Ghyka
(74) *Attorney, Agent, or Firm* — IP & T Group LLP (57) ABSTRACT

A method for fabricating a capacitor of a semiconductor device includes forming a mold layer over a substrate, forming a plurality of preliminary openings by selectively etching the mold layer, forming a plurality of openings where each opening is formed to have a given linewidth by forming a sacrificial layer on sidewalls of the preliminary openings, and forming a plurality of storage nodes in the plurality of openings.

9 Claims, 6 Drawing Sheets

METHOD FOR FABRICATING CAPACITOR OF SEMICONDUCTOR DEVICE

CROSS-REFERENCE TO RELATED APPLICATIONS

This application is a division of U.S. patent application Ser. No. 13/610,588 filed on Sep. 11, 2012, which claims priority of Korean Patent Application No. 10-2012-0071152, filed on Jun. 29, 2012. The disclosure of each of the foregoing applications is incorporated herein by reference in its entirety.

BACKGROUND

1. Field

Exemplary embodiments of the present invention relate to a semiconductor designing technology, and more particularly, to a method for fabricating a capacitor of a semiconductor device.

2. Description of the Related Art

As the integration degree of semiconductor devices increases rapidly, technical difficulty increases as well. For example, a Dynamic Random Access Memory (DRAM) device necessarily requires a process for forming storage nodes having a high aspect ratio in order to provide a capacitor of a required capacitance due to design shrinkage. The storage node process is a process of forming hole-type openings by etching a mold layer and then forming storage nodes in the openings.

FIGS. 1A to 1D are cross-sectional views illustrating a conventional method for fabricating a capacitor of a semiconductor device.

Figure 1A:
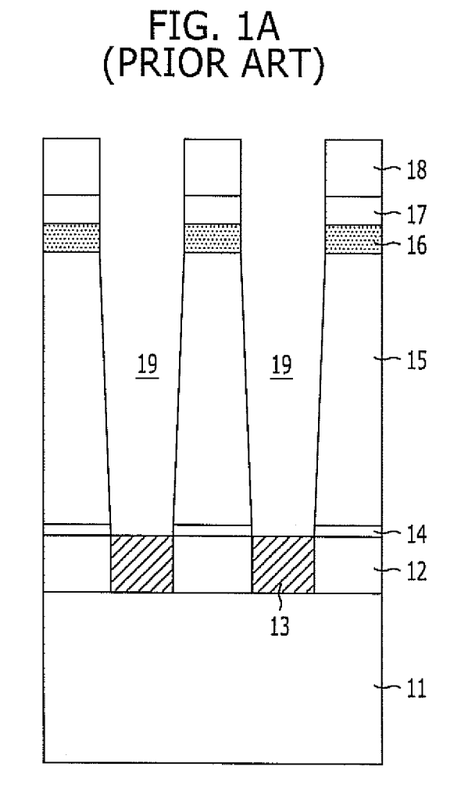
FIGS. 1A to 1D are cross-sectional views illustrating a conventional method for fabricating a capacitor of a semiconductor device.

Referring to FIG. 1A, an inter-layer dielectric layer 12 is formed over a substrate 11 where a predetermined structure is already formed. Subsequently, storage node contact plugs 13 penetrating through the inter-layer dielectric layer 12 are formed.

Subsequently, an etch stop layer 14, a mold layer 15, a support layer 16, a capping layer 17, and a hard mask pattern 18 are sequentially formed over the inter-layer dielectric layer 12. The etch stop layer 14 is formed of a material having an etch selectivity different from the mold layer 15, and the support layer 16 is formed of a material having an etch selectivity different from the mold layer 15 and the capping layer 17. The capping layer 17 prevents the support layer 16 from being lost during a process.

Subsequently, openings 19 that open the storage node contact plugs 13 are formed by using the hard mask pattern 18 as an etch mask and sequentially etching the capping layer 17, the support layer 16, the mold layer 15, and the etch stop layer 14. The hard mask pattern 18 may be removed by being lost during the process of forming the openings 19, or the hard mask pattern 18 may be removed through a process removing the hard mask pattern 18 after the openings 19 are formed.

Figure 1B:
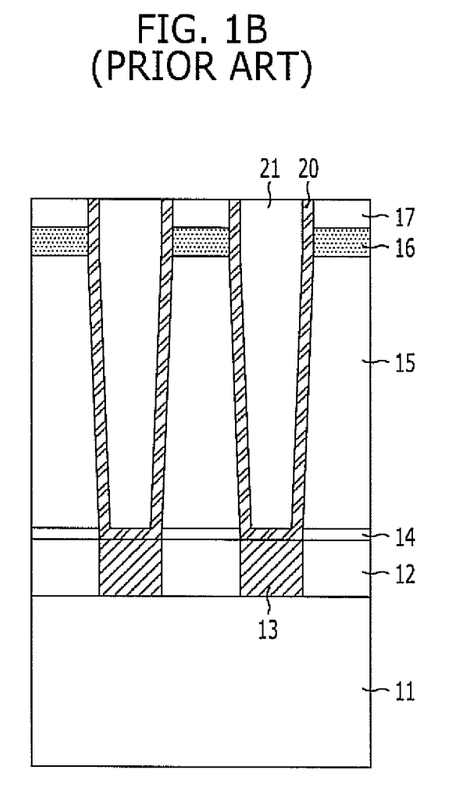

Referring to FIG. 1B, after storage nodes 20 are formed in the openings 19, a sacrificial layer 21 for gap-filling the openings 19 is formed over the storage nodes 20.

Figure 1C:
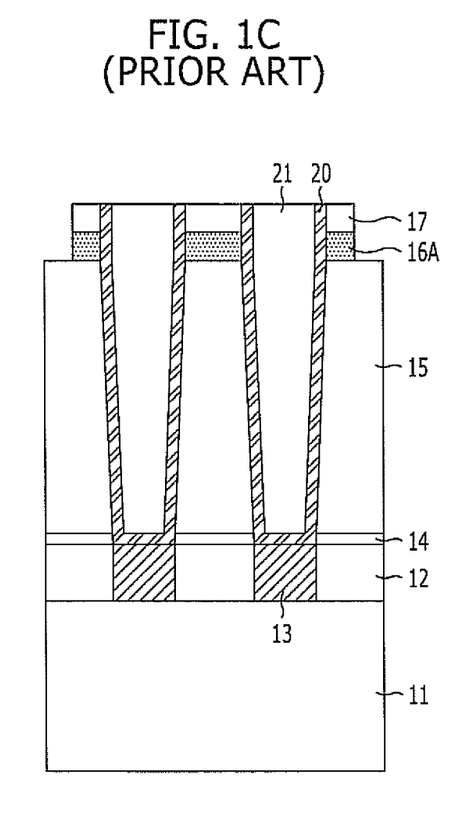

Referring to FIG. 1C, a mask pattern (not shown) is formed over the substrate structure including the sacrificial layer 21, and then a support pattern 16A is formed by using the mask pattern (not shown) as an etch mask and etching the capping layer 17 and the support layer 16. The support pattern 16A prevents the storage nodes 20 from leaning during a subsequent dip-out process.

Figure 1D:
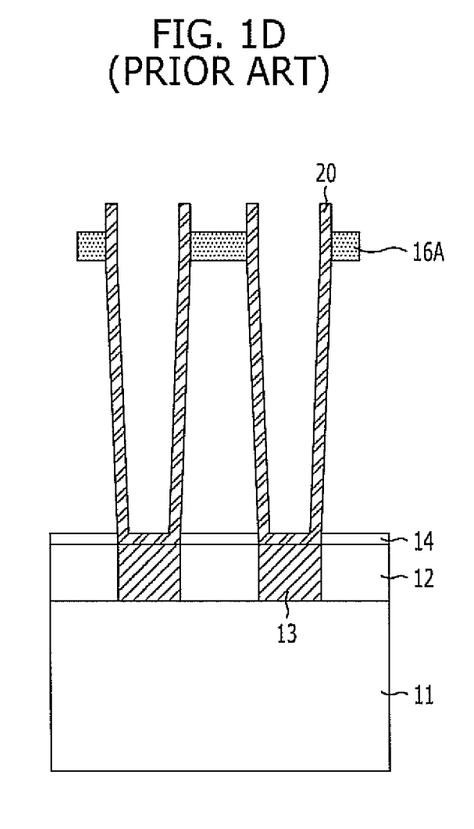

Referring to FIG. 1D, the capping layer 17, the sacrificial layer 21, and the mold layer 15 are removed. The mold layer 15 is removed through a dip-out process, and the support pattern 16A prevents the storage nodes 20 from leaning during the dip-out process. Subsequently, although not illustrated in the drawing, the formation of a capacitor may be completed by sequentially forming a dielectric layer and a plate electrode.

Recently, as the integration degree of semiconductor devices increases, the linewidth of the hole-type openings 19 continues to decrease when a process for forming storage node is performed. In order to form the openings 19 having a linewidth required by the semiconductor device, such methods as Extreme Ultraviolet ray (EUV) patterning technology, Spacer Patterning Technology (SPT), and Double Patterning Technology (DPT) are introduced. At this moment, the EUV patterning technology may take a few more years until EUV patterning equipment is brought to commercial use. Therefore, the EUV patterning technology may not be applied to the formation of the openings 19. For this reason, the openings are being formed through the spacer patterning technology or the double patterning technology.

However, it takes many procedural steps until the hard mask pattern 18 for defining the hole-type openings 19 are formed through the conventional spacer patterning technology or double patterning technology. Therefore, the productivity of using the conventional spacer patterning technology or double patterning technology is low, and there is a shortcoming that the openings 19 are hardly formed in a uniform linewidth. Also, when the openings 19 are formed through the spacer patterning technology or double patterning technology, the number of procedural steps taken to form the hard mask pattern 18 that defines the openings 19 increases by geometric progression as the linewidth of the openings 19 decreases. Thus, the above-mentioned problem becomes even worse.

In addition, because the support layer 16 and the capping layer 17 for protecting the support layer 16 are formed before the formation of the openings 19 according to the conventional technology, the burden for an etch process that is performed to form the openings 19 increases and it is difficult to control the sidewall profile of the openings 19.

SUMMARY

An exemplary embodiment of the present invention is directed to a method for fabricating a capacitor of a semiconductor device that may form openings that have a linewidth required by the semiconductor device without using spacer patterning technology or double patterning technology.

Another exemplary embodiment of the present invention is directed to a method for fabricating a capacitor of a semiconductor device that may alleviate the burden for an etch process that is performed to form openings and easily control the sidewall profile of the openings.

In accordance with an exemplary embodiment of the present invention, a method for fabricating a capacitor of a semiconductor device includes forming a mold layer over a substrate, forming a plurality of preliminary openings by selectively etching the mold layer, forming a plurality of openings where each opening is formed to have a given linewidth by forming a sacrificial layer on sidewalls of the preliminary openings, and forming a plurality of storage nodes in the plurality of openings.

In accordance with another exemplary embodiment of the present invention, a method for fabricating a capacitor of a semiconductor device includes forming a mold layer over a substrate, forming a plurality of preliminary openings by selectively etching the mold layer, forming a plurality of openings where each opening is formed to have a given linewidth by forming a sacrificial layer on sidewalls of the preliminary openings, forming a plurality of cylindrical storage nodes in the openings, forming a protective layer for gap-filling the openings over the storage nodes, forming a plurality of grooves where the storage nodes are protruded above the mold layer by selectively etching the mold layer and the sacrificial layer, forming a support pattern filling the grooves; and removing the mold layer, the sacrificial layer, and the protective layer.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

The following embodiment of the present invention discloses a method for fabricating a capacitor of a semiconductor device where openings having a fine linewidth required by the semiconductor device may be formed without using a Spacer Patterning Technology (SPT) or Double Patterning Technology (DPT) in a process for forming storage nodes that have a high aspect ratio. The method for fabricating a capacitor of a semiconductor device may also alleviate the burden of an etch process for forming openings and easily control the sidewall profile of the openings.

FIGS. 2A to 2H are cross-sectional views illustrating a method for fabricating a capacitor of a semiconductor device in accordance with an embodiment of the present invention.

Figure 2A:
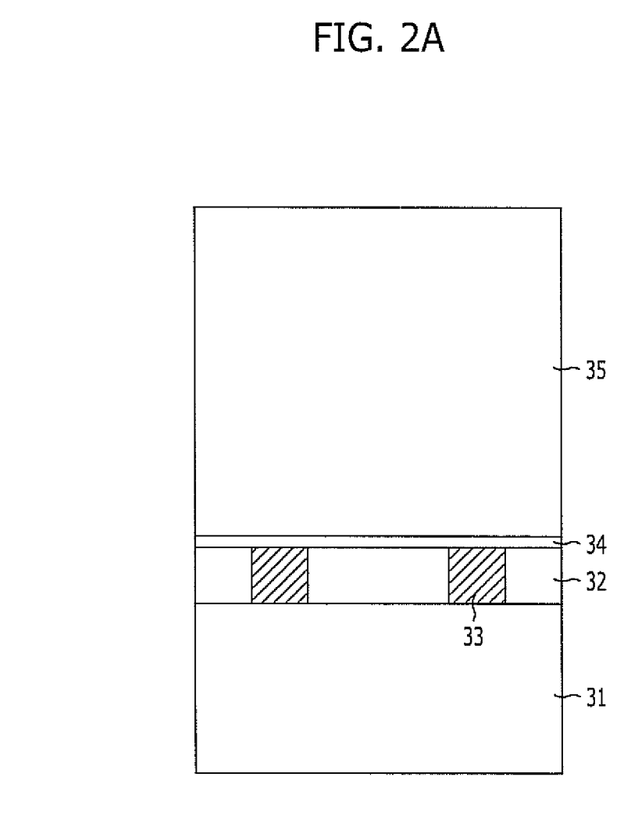
FIGS. 2A to 2H are cross-sectional views illustrating a method for fabricating a capacitor of a semiconductor device in accordance with an embodiment of the present invention.

Referring to FIG. 2A, an inter-layer dielectric layer 32 is formed over a substrate 31 where a predetermined structure is already formed. The inter-layer dielectric layer 32 may include an oxide, a nitride, or an oxynitride. For example, the inter-layer dielectric layer 32 may include an oxide, and the structure formed in the substrate 31 may include transistors, word lines, bit lines, and landing plugs.

Subsequently, a plurality of storage node contact plugs 33 penetrating through the inter-layer dielectric layer 32 are formed. The storage node contact plugs 33 may be formed through a series of procedural steps for forming contact holes by selectively etching the inter-layer dielectric layer 32 and filling the inside of the contact holes with a conductive material. The storage node contact plugs 33 may be a silicon layer doped with an impurity or a metallic layer that has a conductive material including a metal.

Subsequently, an etch stop layer 34 is formed over the inter-layer dielectric layer 32 that includes the storage node contact plugs 33. The etch stop layer 34 may include an oxide layer, a nitride layer, or an oxynitride layer, and the etch stop layer 34 may include a material having a different etch selectivity from the inter-layer dielectric layer 32. For example, the etch stop layer 34 may be a nitride layer.

Subsequently, a mold layer 35 is formed over the etch stop layer 34. The mold layer 35 may include a material having a different etch selectivity from the etch stop layer 34. For example, the mold layer 35 may be an insulation layer, such as an oxide layer or a nitride layer, or it may be a semiconductor layer, such as a silicon layer. Also, the mold layer 35 may be a stacked layer where an insulation layer and a semiconductor layer are stacked. The semiconductor layer may be a doped semiconductor layer that is doped with an impurity, or it may be an undoped semiconductor layer that is not doped with any impurity.

Figure 2B:
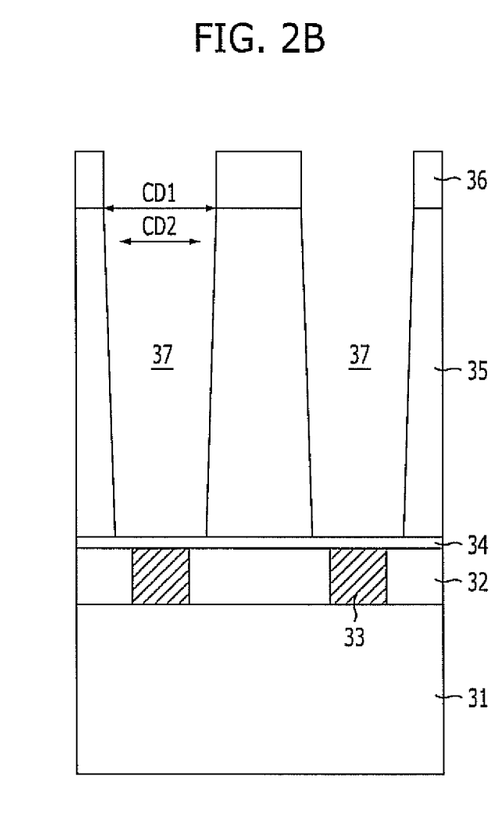

Referring to FIG. 2B, a hard mask pattern 36 is formed over the mold layer 35, and then preliminary openings 37 are formed by using the hard mask pattern 36 as an etch mask and etching the mold layer 35. Herein, the preliminary openings 37 are formed to have a wider linewidth CD1 than a linewidth CD2 of the openings required by the semiconductor device (CD1>CD2). For example, when the semiconductor device requires a linewidth CD2 of the openings of approximately 30 nm, the preliminary openings 37 formed using the hard mask pattern 36 may be formed to have a linewidth CD1 of approximately 40 nm or 50 nm.

In this embodiment of the present invention, because the linewidth CD1 of the preliminary openings 37 formed by using the hard mask pattern 36 is wider than the linewidth CD2 of the openings required by the semiconductor device, the hard mask pattern 36 may be formed without using the spacer patterning technology or the double patterning technology. For example, the hard mask pattern 36 may be formed through a widely known exposure technology that uses ArF or KrF. Therefore, it is possible to prevent the problems (which include decreased productivity and poor uniformity originating from the increased number of procedural steps) occurring from the use of the spacer patterning technology or the double patterning technology.

Also, in this embodiment of the present invention, because the preliminary openings 37 are formed by etching the mold layer 35, the burden for an etch process may be alleviated compared to the conventional technology, and the sidewall profile may be easily controlled. Because the openings are formed by etching a capping layer, a support layer, a mold layer and an etch stop layer that have a different etch selectivity to each other according to conventional technology, the burden for an etch process is great and the sidewall profile can hardly be controlled.

Figure 2C:
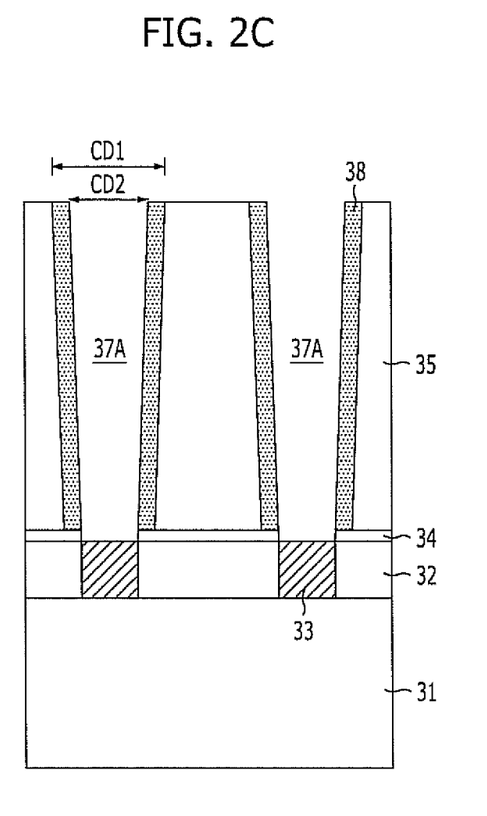

Referring to FIG. 2C, the hard mask pattern 36 is removed. The hard mask pattern 36 is removed by being lost during a process of forming the preliminary openings 37, or the hard mask pattern 36 is removed through a process for removing a hard mask pattern that is performed after the preliminary openings 37 are formed.

Subsequently, a sacrificial layer 38 is formed on the sidewalls of the preliminary openings 37. The sacrificial layer 38 decreases the linewidth CD1 of the preliminary openings 37 into the linewidth required by the semiconductor device is obtained. In other words, openings 37A having a linewidth CD2 required by the semiconductor device are formed by forming the sacrificial layer 38 on the sidewalls of the preliminary openings 37. Therefore, the thickness of the sacrificial layer 38 may be controlled based on the linewidth CD1 of the preliminary openings 37 and the linewidth CD2 of the openings 37A as required by the semiconductor device.

The sacrificial layer 38 may be formed through a series of processes of forming a material layer that has a predetermined thickness on the surface of the substrate structure including the preliminary openings 37 and then performing a blanket etch process, such as an etch-back process. The sacrificial layer 38 may be an insulation layer, for example, an oxide layer or a nitride layer, or the sacrificial layer 38 may be a semiconductor layer, for example, a silicon layer. The sacrificial layer 38 may be formed of the same material as that of the mold layer 35. Although there is no limitation in the kind of materials that may be used for the sacrificial layer 38, it is desirable to use a material having excellent step coverage to form the openings 37A with a uniform linewidth.

Subsequently, the storage node contact plugs 33 are opened by etching the etch stop layer 34 on the bottom surface of the openings 37A.

Figure 2D:
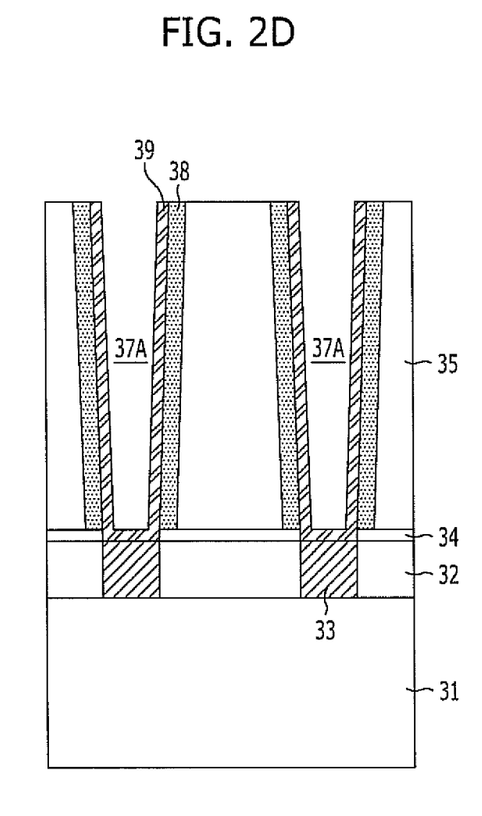

Referring to FIG. 2D, storage nodes 39 are formed in the openings 37A. The storage nodes 39 may be formed in a cylindrical shape. The storage nodes 39 may be formed through a series of processes for forming a conductive layer on the surface of the substrate structure including the openings 37A and then performing a blanket etch process to separate the neighboring storage nodes 39 from each other. Here, the blanket etch process for separating the neighboring storage nodes 39 from each other is performed in such a manner that the conductive layer on the bottom surface of the openings 37A is not etched by controlling the procedural conditions such as a bias power and pressure.

In another exemplary embodiment, the storage nodes 39 may be formed in a shape of pillars as well.

Figure 2E:
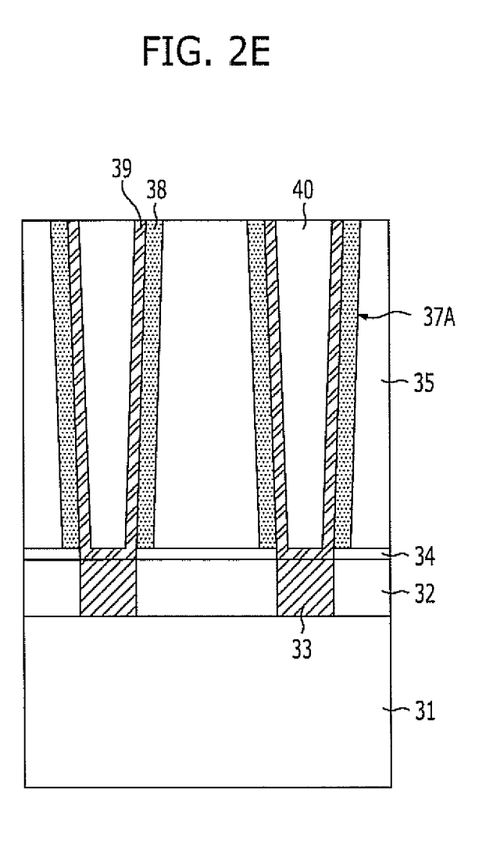

Referring to FIG. 2E, a protective layer 40 for gap-filling the openings 37A is formed over the storage nodes 39. The protective layer 40 protects the storage nodes 39 while a subsequent process is performed. The protective layer 40 may be formed of a material having a different etch selectivity from the mold layer 35 and the sacrificial layer 38. For example, the protective layer 40 may be a polysilicon layer.

The protective layer 40 for gap-filling the openings 37A may be formed through a series of processes of forming a protective layer over the substrate 31 and then performing a planarization process until the mold layer 35 is exposed. The planarization process may include a Chemical Mechanical Polishing (CMP) process.

Meanwhile, if the storage nodes 39 are formed in a pillar shape, the process of forming the protective layer 40 may be omitted.

Figure 2F:
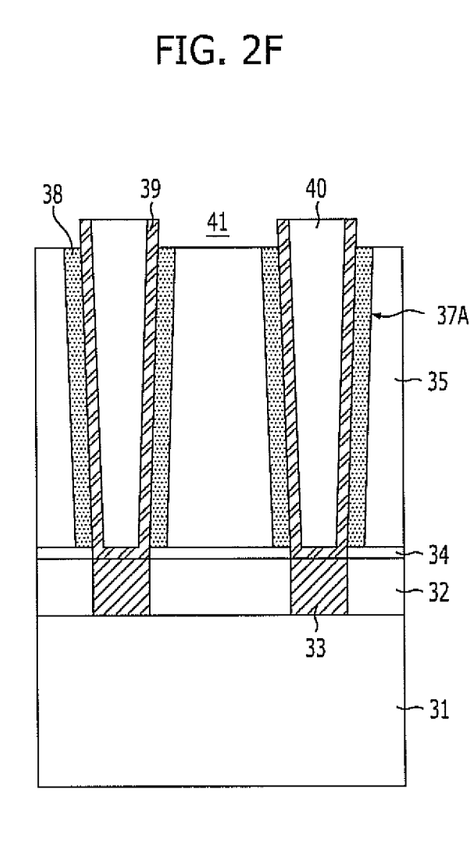

Referring to FIG. 2F, a mask pattern (not shown) is formed over the substrate structure including the protective layer 40, and then a recess process is performed to etch the mold layer 35 and the sacrificial layer 38 by a given thickness by using the mask pattern (not shown) as an etch mask. As a result, grooves 41 where a portion of each storage node 39 is protruded above the mold layer 35 are formed. The grooves 41 provide the space where a support pattern is subsequently formed. Therefore, the shape of the grooves 41 is controlled based on the shape of the support pattern that is subsequently formed.

Meanwhile, when the mold layer 35 and the sacrificial layer 38 may be formed of the same material, the recess process for forming the grooves 41 may be performed more easily.

Figure 2G:
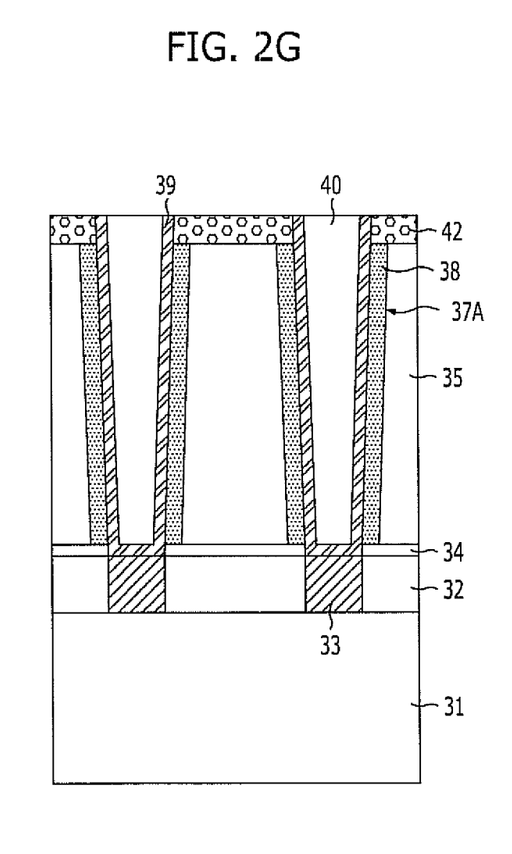
Figure 2H:
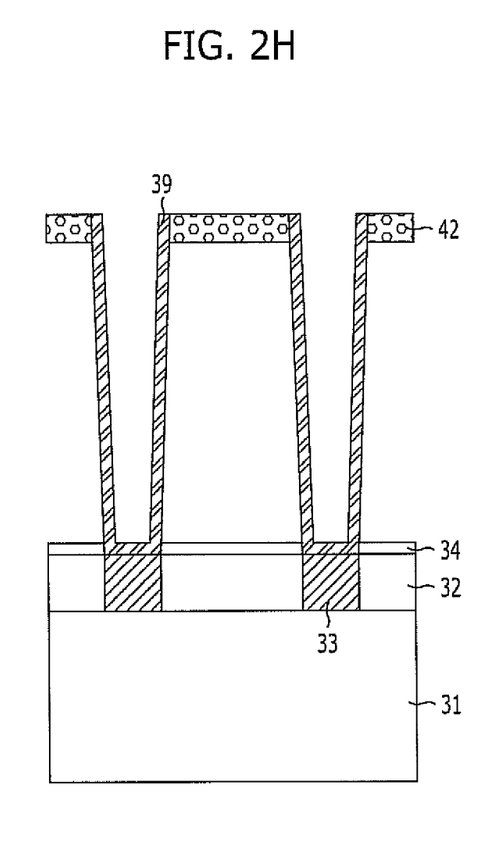

Referring to FIG. 2G, after the mask pattern (not shown) is removed, a support layer is formed over the profile of the substrate 31 to fill the grooves 41, and then a planarization process is performed until the protective layer 40 is exposed. As a result, a support pattern 42 filling the grooves 41 is formed. The planarization process may be a CMP process. The support pattern 42 may include an oxide layer, a nitride layer, or an oxynitride layer, and the support pattern 42 may include a material having a different etch selectivity from the protective layer 40, the sacrificial layer 38, and the mold layer 35. For example, the support pattern 42 may be a nitride layer.

Referring to FIG. 2G, the protective layer 40, the sacrificial layer 38, and the mold layer 35 are removed. The mold layer 35 may be removed through a dip-out process. The protective layer 40 and the sacrificial layer 38 may be removed through the dip-out process as well. The support pattern 42 prevents the storage nodes 39 from leaning in the course of removing the protective layer 40, the sacrificial layer 38, and the mold layer 35.

Subsequently, although not illustrated in the drawing, a dielectric layer and a plate electrode may be sequentially formed to complete the formation of a capacitor of a semiconductor device.

According to the embodiment of the present invention described above, the linewidth of the openings 37A required by the semiconductor device is realized by forming the preliminary openings 37 and then reducing the linewidth of the preliminary openings 37 in use of the sacrificial layer 38. In this way, the problems occurring in the formation of the openings 37A through a spacer patterning technology or a double patterning technology may be prevented. Therefore, the number of procedural steps may be dramatically decreased in comparison with that of the conventional technology, and the productivity may be increased while providing the openings 37A having a uniform linewidth.

Also, because the support pattern 42 is formed after the storage nodes 39 are formed, the burden for an etch process for forming the openings 37A may be alleviated and the sidewall profile of the openings 37A may be easily controlled.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor of a semiconductor device, comprising:
    forming a mold layer over a substrate;
    forming a plurality of preliminary openings by selectively etching the mold layer;
    forming a plurality of openings where each opening is formed to have a given linewidth by forming a sacrificial layer on sidewalls of the preliminary openings;
    forming a plurality of cylindrical storage nodes in the openings;
    forming a protective layer for gap-filling the openings over the storage nodes;
    forming a plurality of grooves where the storage nodes are protruded above the mold layer by selectively etching the mold layer and the sacrificial layer;
    forming a support pattern filling the grooves; and
    removing the mold layer, the sacrificial layer, and the protective layer.

2. The method of claim 1, wherein the mold layer is an insulation layer or a semiconductor layer, or a stacked layer where an insulation layer and a semiconductor layer are stacked.

3. The method of claim 1, wherein the sacrificial layer is formed by:
    forming a sacrificial layer having a given thickness on the profile of the substrate including the preliminary openings; and
    performing a blanket etch process on the sacrificial layer.

4. The method of claim 1, wherein the sacrificial layer is formed of the same material as the mold layer.

5. The method of claim 1, wherein the forming of the protective layer includes:
    forming a protective layer on the profile of the substrate including the storage nodes to gap-fill the openings; and
    performing a planarization process until the mold layer is exposed.

6. The method of claim 1, wherein the protective layer is formed of a material having a different etch selectivity from the mold layer and the sacrificial layer.

7. The method of claim 1, wherein the forming of the grooves includes:
    forming a mask pattern over the substrate including the storage nodes;
    performing a recess etch process of etching the mold layer and the sacrificial layer by a given thickness by using the mask pattern as an etch barrier; and
    removing the mask pattern.

8. The method of claim 1, wherein the forming of the support pattern includes:
    forming a support layer on the profile of the substrate including the grooves; and
    performing a planarization process until the storage nodes are exposed.

9. The method of claim 1, wherein the support pattern includes a material having a different etch selectivity from the sacrificial layer, the mold layer, and the protective layer.

* * * * *